(12) United States Patent
Castro et al.

(10) Patent No.: US 12,087,673 B2
(45) Date of Patent: *Sep. 10, 2024

(54) QFN DEVICE HAVING A MECHANISM THAT ENABLES AN INSPECTABLE SOLDER JOINT WHEN ATTACHED TO A PWB AND METHOD OF MAKING SAME

(71) Applicant: Texas Instruments Incorporated, Dallas, TX (US)

(72) Inventors: Abram Castro, Carrollton, TX (US); Usman Chaudhry, Mckinney, TX (US); Joe Adam Garcia, Lavon, TX (US); Mahmud Halim Chowdhury, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/983,249

(22) Filed: Nov. 8, 2022

(65) Prior Publication Data

US 2023/0057405 A1 Feb. 23, 2023

Related U.S. Application Data

(62) Division of application No. 16/411,457, filed on May 14, 2019, now Pat. No. 11,495,524.

(Continued)

(51) Int. Cl.
*H01L 23/495* (2006.01)
*H01L 21/48* (2006.01)
(Continued)

(52) U.S. Cl.
CPC ...... *H01L 23/4952* (2013.01); *H01L 21/4825* (2013.01); *H01L 21/67138* (2013.01); *H01L 23/3121* (2013.01); *H01L 23/49541* (2013.01); *H05K 1/181* (2013.01); *H05K 3/3436* (2013.01); *H05K 3/3442* (2013.01); *H05K 3/3494* (2013.01); *H01L 22/20* (2013.01); *H01L 24/32* (2013.01); *H01L 24/48* (2013.01); *H01L 24/73* (2013.01); *H01L 24/83* (2013.01); *H01L 24/85* (2013.01); *H01L 24/92* (2013.01); *H01L 24/97* (2013.01); *H01L 2224/32245* (2013.01); *H01L 2224/48091* (2013.01); *H01L 2224/48106* (2013.01); *H01L 2224/48247* (2013.01);

(Continued)

(58) Field of Classification Search
CPC ............ H01L 21/4825; H01L 23/4952; H01L 23/3121; H01L 23/49541; H05K 3/3442; H05K 3/3494; H05K 3/3436; H05K 1/181; H05K 2201/10636
See application file for complete search history.

(56) References Cited

U.S. PATENT DOCUMENTS 6,472,611 B1 10/2002 Dunford
11,495,524 B2 * 11/2022 Castro ............... H01L 23/49517
(Continued)

*Primary Examiner* — Tucker J Wright
(74) *Attorney, Agent, or Firm* — Ronald O. Neerings; Frank D. Cimino

(57) ABSTRACT

An apparatus and method for providing an artificial standoff to the bottom of leads on a QFN device sufficient to provide a gap that changes the fluid dynamics of solder flow and create a unique capillary effect that drives solder up the of leads of a QFN device when it is attached to a printed wiring board (PWB).

20 Claims, 16 Drawing Sheets

FIG. 22

Related U.S. Application Data

(60) Provisional application No. 62/683,785, filed on Jun. 12, 2018.

(51) Int. Cl.
 *H01L 21/67* (2006.01)
 *H01L 23/31* (2006.01)
 *H05K 1/18* (2006.01)
 *H05K 3/34* (2006.01)
 *H01L 21/66* (2006.01)
 *H01L 23/00* (2006.01)

(52) U.S. Cl.
 CPC ............... *H01L 2224/73265* (2013.01); *H01L 2224/92247* (2013.01); *H01L 2924/3511* (2013.01); *H05K 2201/10636* (2013.01)

(56) References Cited

U.S. PATENT DOCUMENTS

| | | |
|---|---|---|
| 2012/0199962 A1 | 8/2012 | Holloway |
| 2013/0049179 A1 | 2/2013 | Desai et al. |
| 2013/0280866 A1 | 10/2013 | Nondhasithichal et al. |
| 2014/0151865 A1 | 6/2014 | Koshchmieder |
| 2015/0270205 A1 | 9/2015 | Tollafied |
| 2016/0276251 A1 | 9/2016 | Mustanir et al. |

* cited by examiner

| | QFN 2mil PCC BUMP2 (1-PT) | | | | |
|---|---|---|---|---|---|
| | X | Y | BALL HT | STUD HT | STUD TEAR |
| 1 | 116.8 | 107.7 | 26.2 | 56.8 | 62.7 |
| 2 | 114.7 | 109.3 | 25.1 | 56.9 | 62.0 |
| 3 | 112.1 | 109.6 | 25.3 | 56.1 | 60.2 |
| 4 | 115.6 | 110.6 | 25.9 | 57.3 | 62.5 |
| 5 | 111.5 | 102.2 | 24.4 | 54.8 | 59.0 |
| 6 | 112.1 | 103.3 | 24.6 | 54.6 | 62.7 |
| 7 | 110.6 | 109.8 | 26.7 | 57.8 | 62.2 |
| 8 | 115.3 | 108.4 | 25.8 | 55.7 | 61.7 |
| 9 | 115.2 | 106.0 | 25.6 | 55.5 | 60.3 |
| 10 | 119.5 | 106.7 | 24.8 | 55.7 | 60.7 |
| 11 | 116.1 | 106.3 | 24.5 | 57.2 | 62.8 |
| 12 | 117.9 | 106.4 | 24.4 | 54.1 | 59.5 |
| Min | 110.6 | 102.2 | 24.4 | 54.1 | 59.0 |
| Max | 119.5 | 110.6 | 26.7 | 57.8 | 62.8 |
| Avg | 114.78 | 107.19 | 25.28 | 56.04 | 61.36 |
| STDev | 2.723 | 2.585 | 0.769 | 1.177 | 1.353 |

QFN DEVICE HAVING A MECHANISM THAT ENABLES AN INSPECTABLE SOLDER JOINT WHEN ATTACHED TO A PWB AND METHOD OF MAKING SAME

CROSS REFERENCE TO RELATED APPLICATIONS

This application is a Divisional of application Ser. No. 16/411,457 filed May 14, 2019, which claims the benefit of Provisional Application Serial Nos. 62/683,785 filed Jun. 12, 2018 entitled "LOW COST SOLUTION FOR A WET-TABLE FLANK QFN PACKAGE USING STUD BUMP TECHNOLOGY", which is herein incorporated by reference in its entirety.

BACKGROUND

Component packaging is often driven by the consumer electronics market with less consideration given to higher reliability industries such as automotive, medical, industrial & aviation. Improved packaging technologies and component miniaturization can often lead to new or unexpected design, manufacturing, and reliability issues. This has been the case with non-leaded devices (for example, Quad-flat non-lead (QFN) and Small Outline non-leaded (SON) devices), especially when it comes to adoption by new non-consumer electronic original equipment manufacturers (OEMs). It can therefore be challenging to integrate component device families, such as the QFN, into high reliability environments. QFN components are known to be susceptible to solder fatigue issues, especially thermo-mechanical fatigue due to thermal cycling. The significantly lower standoff in QFN devices can lead to higher thermo-mechanical strains due to coefficient of thermal expansion (CTE) mismatch as compared to leaded devices.

There are also issues on the manufacturing side. For larger QFN components, moisture absorption during solder reflow can be a concern. If there is a large amount of moisture absorption into the device then heating during reflow can lead to excessive component warpage. This often results in the corners of the component lifting off the printed circuit board causing improper joint formation. Several other issues with QFN manufacturing include: part floating due to excessive solder paste under the center thermal pad, large solder voiding, poor rework able characteristics, and optimizing the solder reflow profile. However, one of the most significant issues preventing widespread adoption of QFN devices into high reliability environments is the inability of automated solder joint inspection equipment to adequately inspect the solder joints of QFN devices, which have no contact through-holes and/or external leads extending outward from the QFN devices. The result is a significant problem in that manufacturers who integrate QFN devices onto PWBs cannot adequately inspect the solder joints between the QFN devices and the PWB to which the QFN devices are attached. In contrast, leaded devices can be inspected because the leads extend outward and away from the leaded device and the corresponding solder joints each form a solder fillet, which is visible.

As mentioned previously, QFN is a widely used device in the consumer electronics market. QFN devices have been in use for about 20 years. Unlike for leaded devices, in QFN, the electrical contacts or terminals are inset into the mold cap. Nothing extends from the device in order to surface mount, as shown in FIG. 1. This feature of the non-leaded packages (QFN and SON) allows them to be small, on the order chip-scale.

A QFN device begins with a lead frame having a die attach pad 14, which may also serve as a thermal pad, and leads 12, as shown in FIG. 2. In at least one embodiment the lead frame is constructed of copper material, 200 um (or 8 mils) thick and the width of each lead is 200 mm. Next, an integrated circuit (IC) die 18 is attached, via die attach material 22, to a top surface of the die attach pad. Next, wire bonds 20 are formed between the lead frame leads and the electrical contacts or terminals of the IC die. Finally, the resulting combination of IC die, die support pad, lead frame and bond wires are encapsulated with a mold compound 16. Typically plastic is used as the mold compound, but use of other materials, including ceramics, can also be used. In a typical QFN fabrication process 34, there are multiple QFN devices 10 on a leadframe strip 36 that are block molded/encapsulated at the same time, as shown in FIG. 3. The QFN devices 10 are thereafter singulated to produce individual QFN devices, as shown in FIGS. 1 & 2. A flat surface at the bottom of the QFN device is the only contact surface for mounting to a printed wiring board (PWB). Leads 12 and die attach/thermal pad 14 are not covered by the plastic mold/encapsulant 16. The exposed surface of the die attach/thermal pad 14 can be soldered to a corresponding pad on a PWB or attached with other heat conductive die attach material. The leads 12 of QFN device 10 can be soldered to corresponding electrical contacts or terminals, on a PWB. FIGS. 1-3 show that a first portion of each of the leads 12 are exposed on a bottom surface of QFN device 10 and an end portion of each of leads 12 are exposed on a side surface of QFN device 10. The side surfaces of the electrical contacts or terminals are typically exposed during a singulation process during which a saw is used to cut each QFN device 10 from production mold strip 36 which cuts through an end portion of each of the leads 12 and exposes the resulting side surfaces. The result is that bottom and side surfaces of leads 12 are exposed.

SUMMARY

This Summary is provided to introduce a brief selection of disclosed concepts in a simplified form that are further described below in the Detailed Description including drawings provided. This Summary is not intended to limit the claimed subject matter's scope Described examples provide QFN devices having a mechanism that enables an inspectable solder joint when attached to a PWB, and a method of making the same. Other examples combine a QFN device with a PWB, and a method of making the same. Yet other examples provide a method of manufacturing multiple QFN devices having the mechanism for enabling an inspectable solder joint.

In one example, the apparatus includes a lead frame having leads and a die attach pad, an integrated circuit (IC) die attached to the die attach pad, an encapsulating material enclosing the integrated circuit (IC) die and all but one surface of the leads and die attach pad, and a standoff mechanism on selected ones of the leads on the surface not enclosed by the encapsulating material.

In another example, a method includes providing a lead frame having leads and a die attach pad, attaching an integrated circuit (IC) die to the die attach pad, encapsulating the integrated circuit (IC) die and all but one surface of the leads and die attach pad with a mold compound, and forming a standoff mechanism on selected ones of the leads on the surface not enclosed by the encapsulating material.

In yet another example, the apparatus includes a printed wiring board (PWB), a lead frame having leads and a die attach pad, an integrated circuit (IC) die attached to the die attach pad, an encapsulating material enclosing the integrated circuit (IC) die and all but one surface of the leads and die attach pad, and a standoff mechanism on selected ones of the leads on the surface not enclosed by the encapsulating material, each standoff mechanism attached to a corresponding electrical conductor or pad on the PWB.

In still another example, a method includes providing a printed wiring board (PWB), providing a lead frame having leads and a die attach pad, attaching an integrated circuit (IC) die to the die attach pad, encapsulating the integrated circuit (IC) die and all but one surface of the leads and die attach pad with a mold compound, forming a standoff mechanism on selected ones of the leads on the surface not enclosed by the encapsulating material, and attaching each standoff mechanism to a corresponding electrical conductor or pad on the PWB.

In still yet another example, a method includes a method of manufacturing integrated circuit (IC) devices that includes providing a strip of conjoined lead frames, each lead frame comprising a die attach pad and leads, attaching an integrated circuit device (IC) to each die attach pad, installing a bond wire from each lead to a respective electrical bond pad or conductor on the IC on the respective die attach pad, bulk molding the strip of conjoined lead frames with encapsulating material enclosing the integrated circuit (IC) dies and all but one surface of each of the leads and die attach pads, testing each IC device for electrical functionality, forming a standoff mechanism on selected ones of the leads on the surfaces not enclosed by the encapsulating material, and singulating the strip of conjoined lead frames.

DETAILED DESCRIPTION

Figure 1:
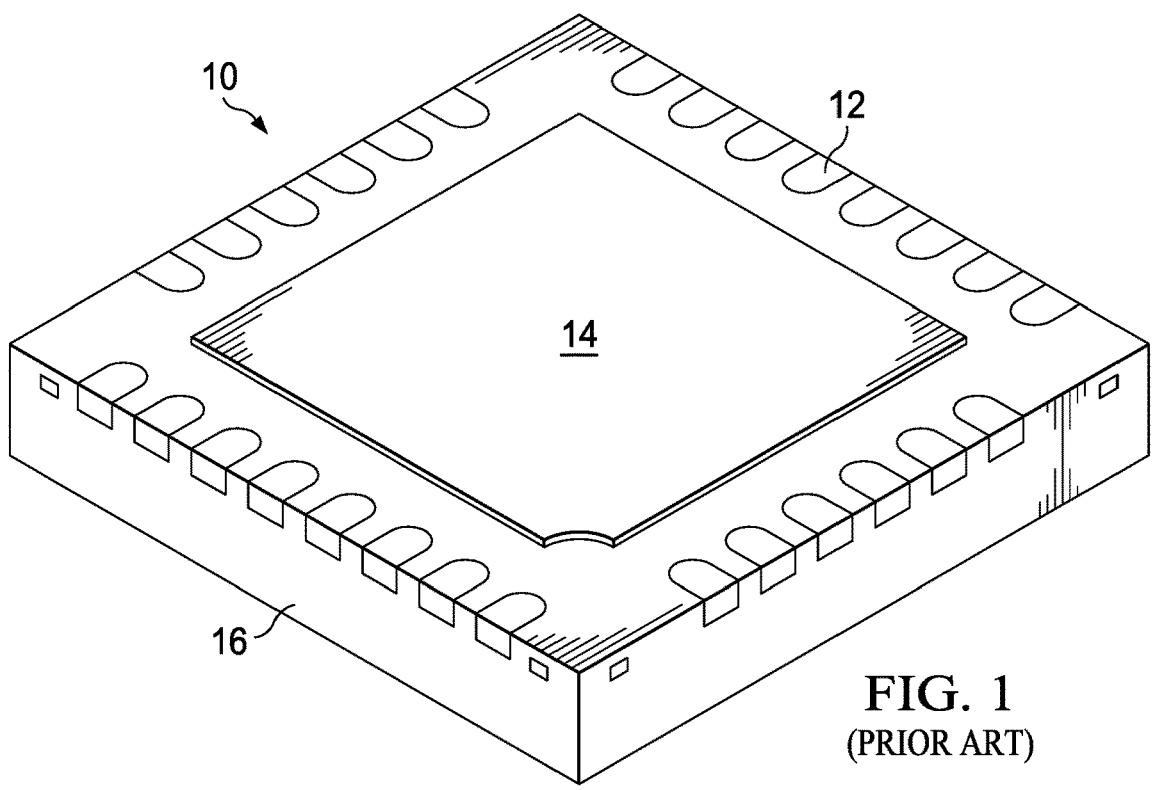
FIG. 1 is a perspective view of a bottom surface of a typical 28-pin, single row, QFN device.
Figure 2:
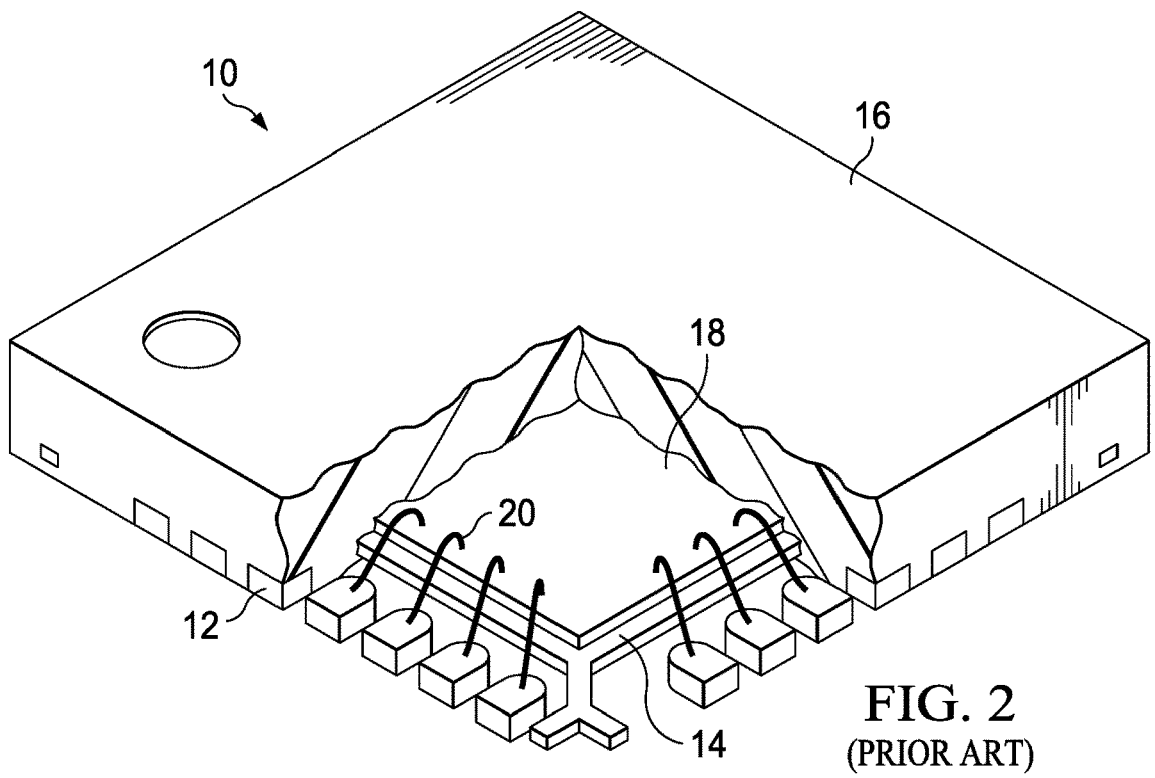
FIG. 2 is a perspective view of a top surface of the QFN device of FIG. 1 with a portion of the device encapsulation material removed.
Figure 3:
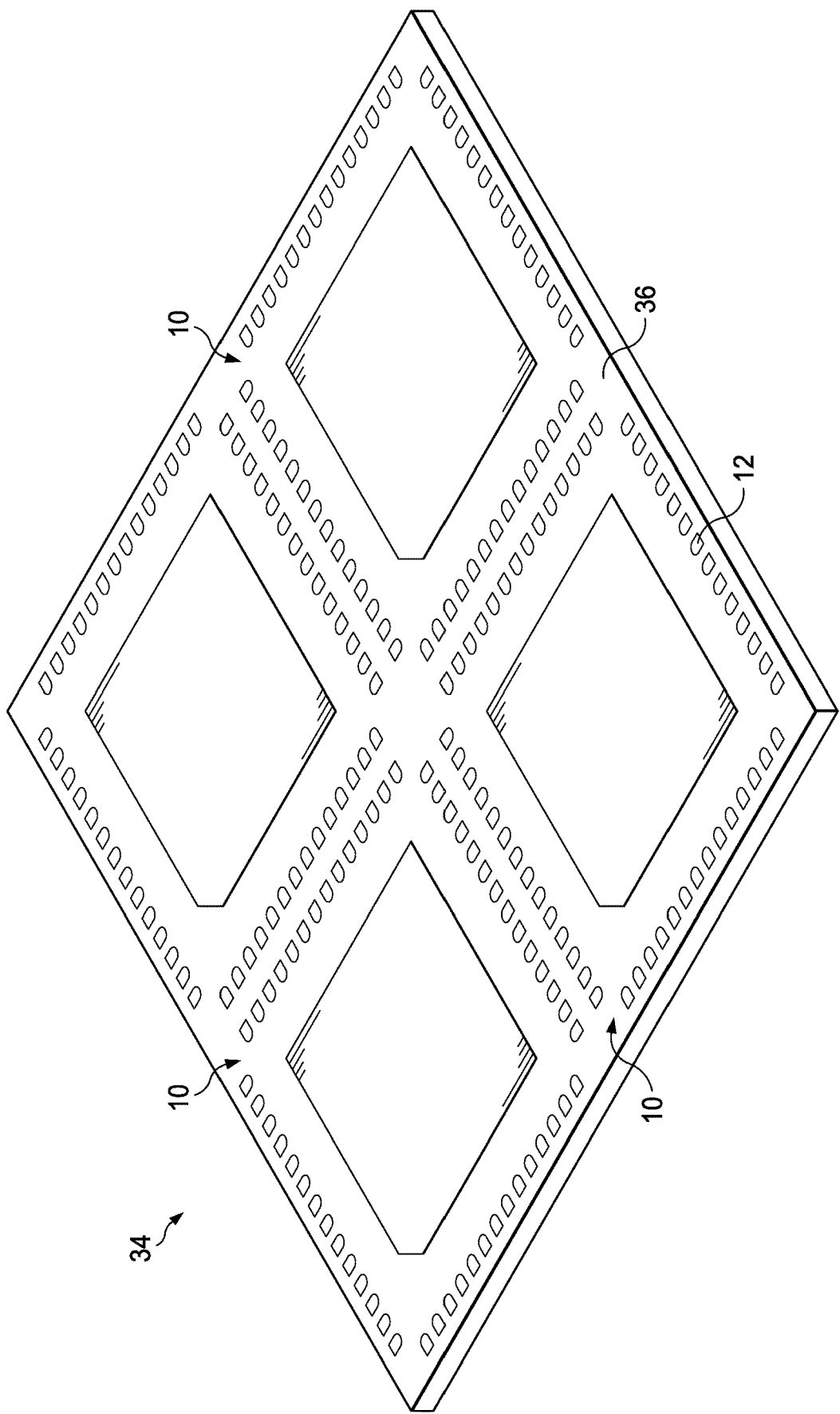
FIG. 3 is a perspective view of multiple QFN devices on a leadframe strip subsequent to block molding but prior to singulation.

In the drawings, like reference numerals refer to like elements throughout, and the various features are not necessarily drawn to scale. In the following discussion and in the claims, the terms "including", "includes", "having", "has", "with", or variants thereof are intended to be inclusive in a manner similar to the term "comprising", and thus should be interpreted to mean "including, but not limited to . . . " Also, the term "couple" or "couples" is intended to include indirect or direct electrical or mechanical connection or combinations thereof. For example, if a first device couples to or is coupled with a second device, that connection may be through a direct electrical connection, or through an indirect electrical connection via one or more intervening devices and connections.

In order to overcome the deficiencies of presently available QFN devices the present disclosure describes multiple embodiments for creating a standoff between a QFN device and a PCB that will change the dynamics of the way solder flows under and outside the QFN device. The result is a QFN device that enables a solid solder joint with a long strong fillet that electrically and mechanically connects the QFN device to a PWB that can be adequately inspected with automated solder joint inspection equipment.

Figure 4:
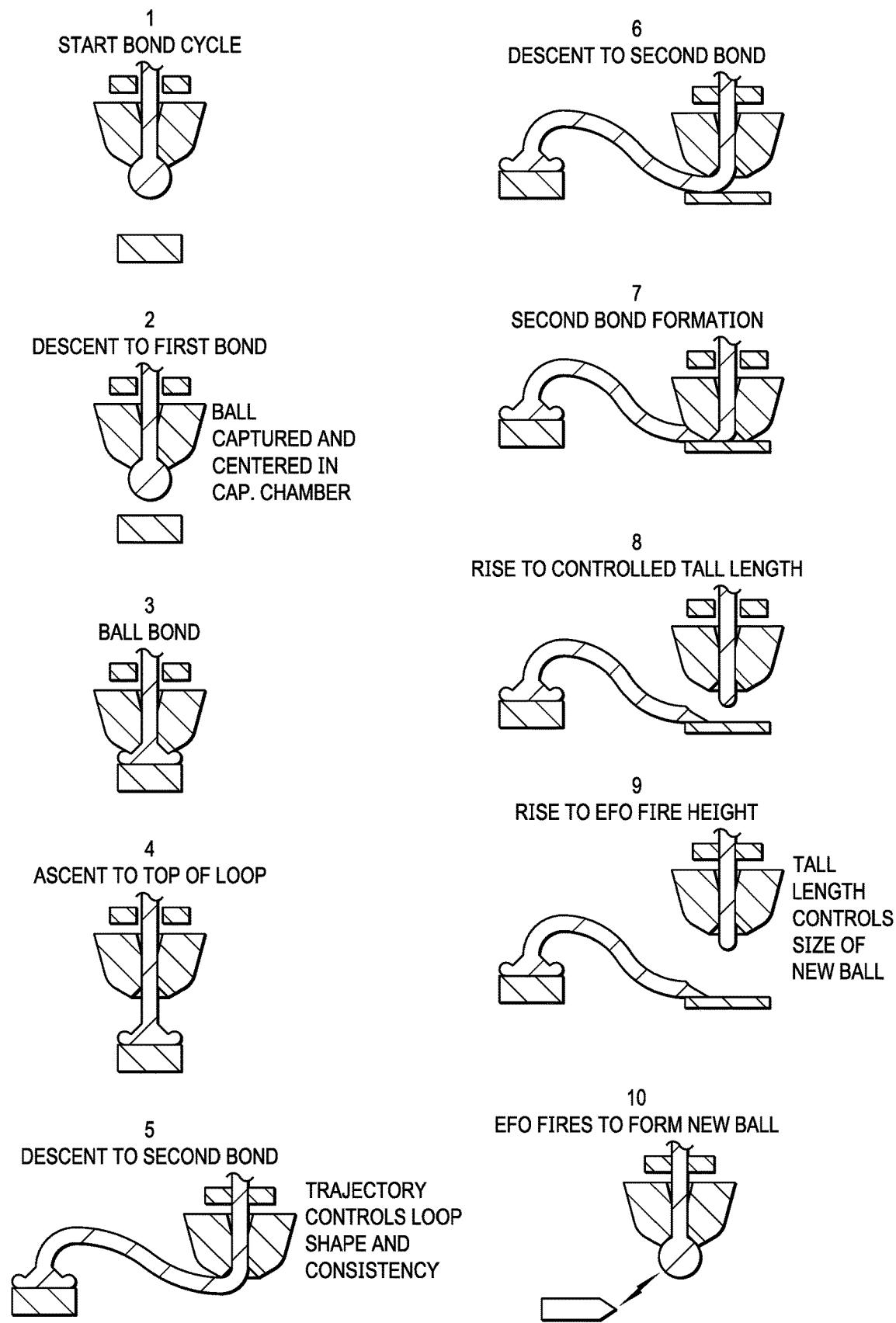
FIG. 4 discloses the various steps of a ball bonding process.

Wirebonding, or wire bonding, is a process of providing electrical connection between a silicon chip and external leads of a semiconductor device using very find bonding wires. Typically, gold (Au), aluminum (Al), or copper (Cu) wire is used. During ball wire bonding, a ball is first formed by melting the end of the wire (which is held by a bonding tool known as a capillary) through electronic flame-off (EFO). This free-air ball has a diameter ranging from 1.5 to 2.5 times the wire diameter. Free air ball size consistency, controlled by the EFO and the tail length, is critical in good bonding. The free-air ball is then brought into contact with the bond pad. Adequate amounts of pressure, heat, and ultrasonic forces are then applied to the ball for a specific amount of time, forming the initial metallurgical weld between the ball and the bond pad as well as deforming the ball bond itself into its final shape. The wire is then run to the corresponding finger of the leadframe, forming a gradual arc or "loop" between the bond pad and the leadfinger. Pressure and ultrasonic forces are applied to the wire to form the second bond (known as a wedge bond, stitch bond, or fishtail bond, this time with the leadfinger. The wirebonding machine or wirebonder breaks the wire in preparation for the next wirebonding cycle by clamping the wire and raising the capillary. FIG. 4 discloses the various steps of the above ball bonding process.

Figure 5:
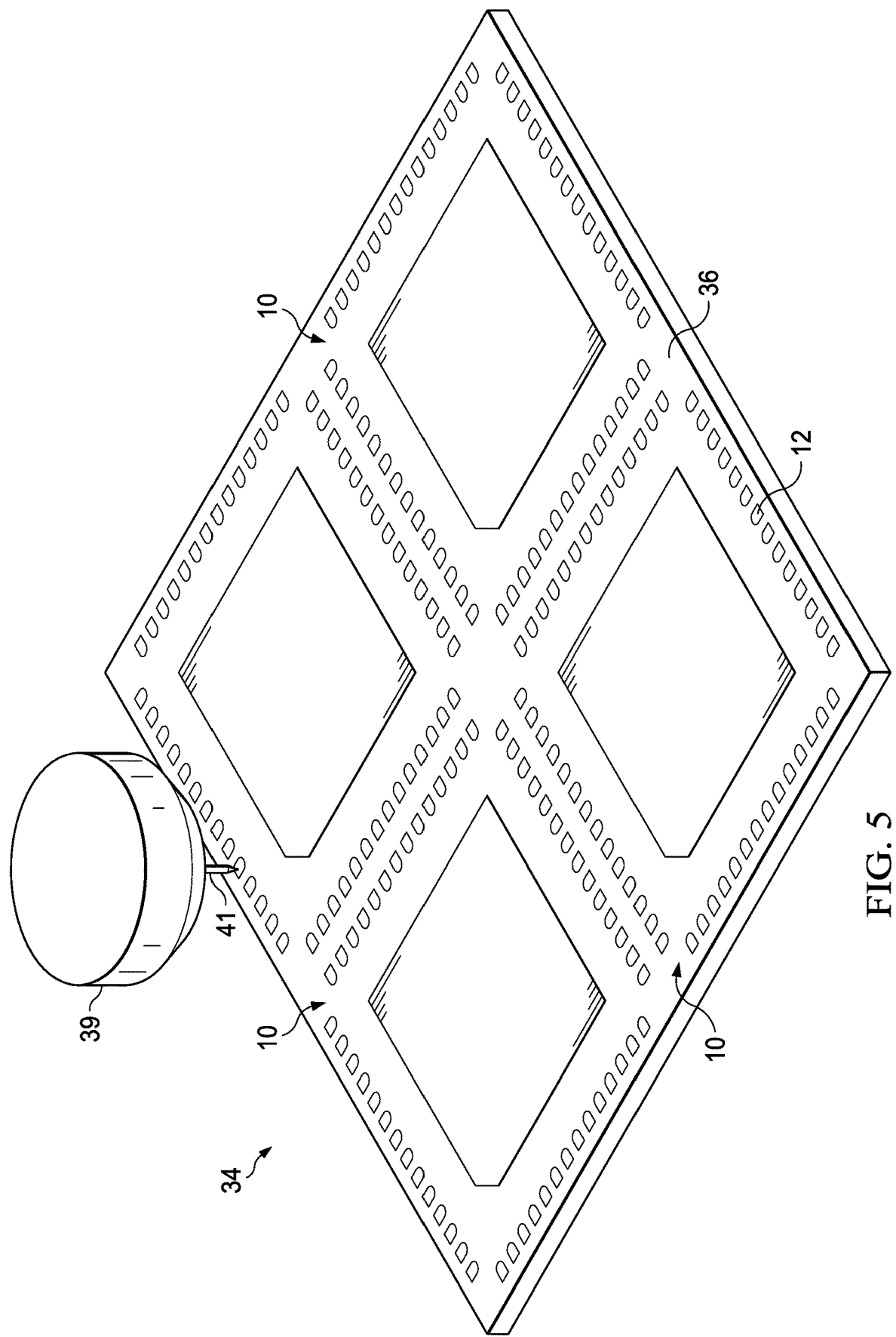
FIG. 5 shows a wirebonder placed over a lead on a QFN device ready to install a stud bump.
Figure 6:
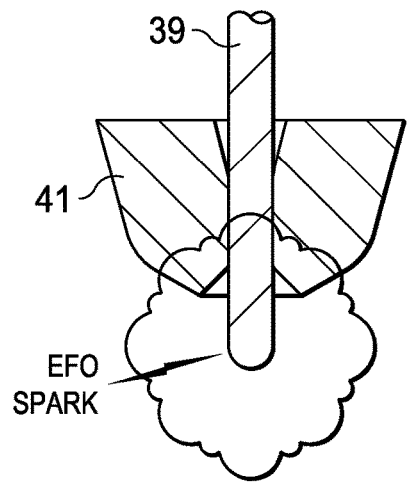
FIG. 6 shows a wire fed into and through a capillary in a wirebonder at which time an electronic flame-off (EFO) spark is provided near the exposed end of the wire.
Figure 7:
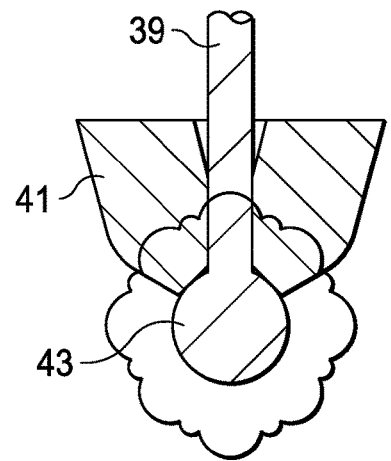
FIG. 7 shows a ball formed by melting the end of the wire in FIG. 6 as a result of electronic flame-off (EFO).
Figure 8:
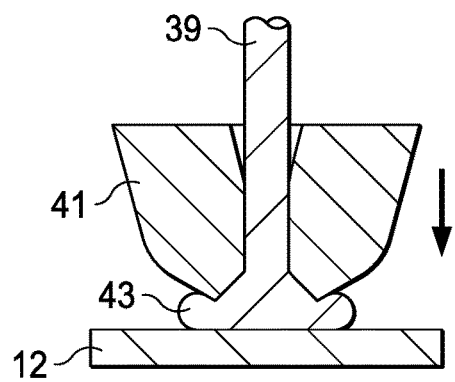
FIG. 8 shows a capillary containing the molten ball in FIG. 7 being lowered such that ball contacts and is compressed against a lead on the QFN device, resulting in a compressed ball attached (welded) to a lead on the QFN device.
Figure 9:
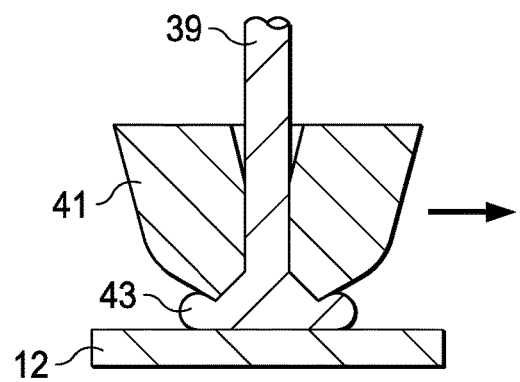
FIG. 9 shows the capillary in FIG. 8 moving horizontally to sheer off wire from the compressed ball resulting in stud bump.
Figure 10:
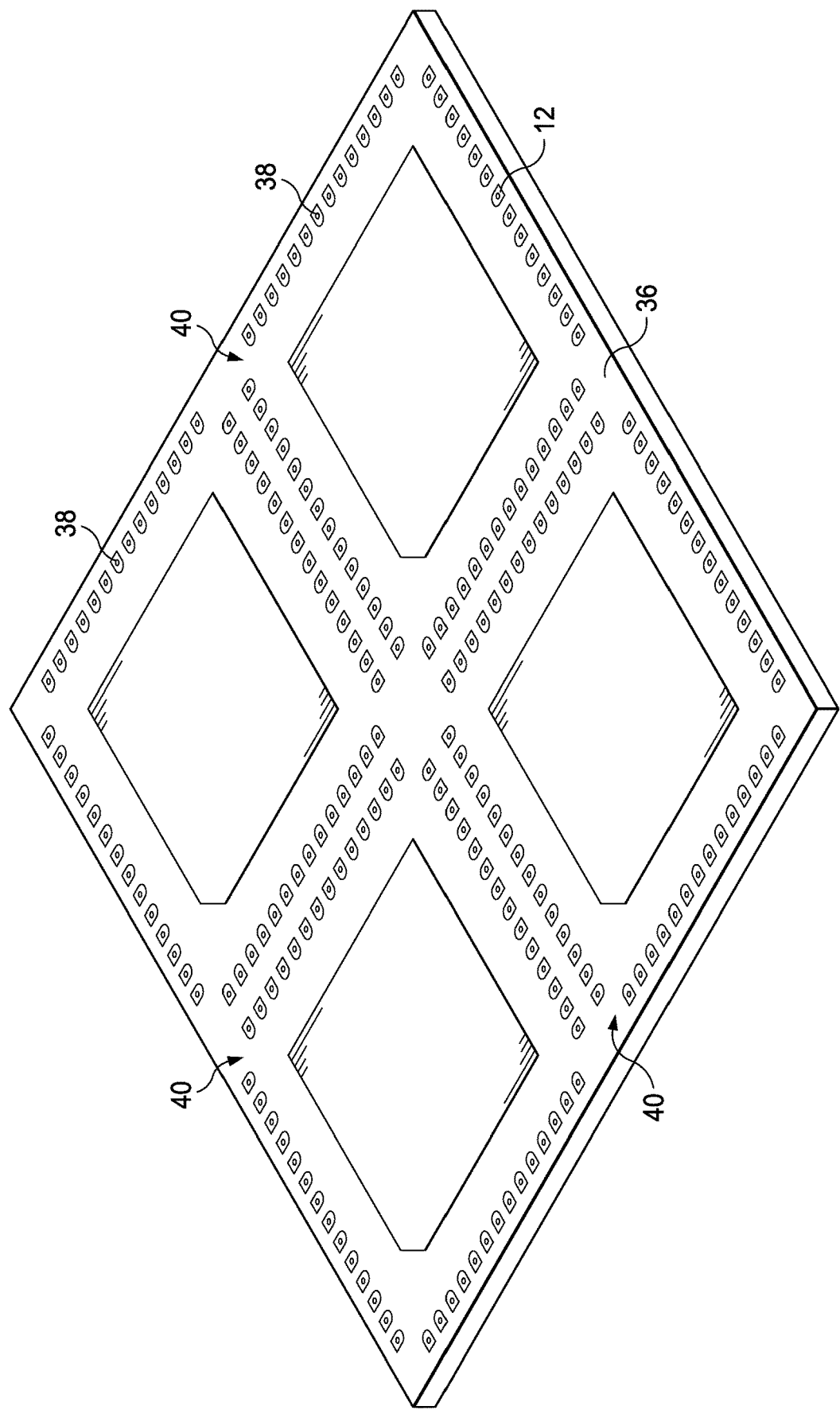
FIG. 10 is a perspective view of multiple QFN devices on a strip subsequent to block molding and subsequent to placement of a stud bump on leads of each of the QFN devices, but prior to singulation.
Figure 11:
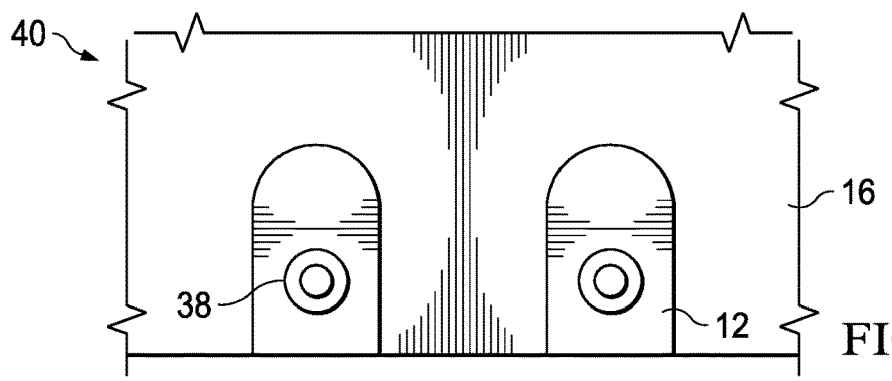
FIG. 11 is an enhanced view of two of the leads on one of the QFN devices shown in FIG. 11, each of the leads having a stud bump.
Figure 12:
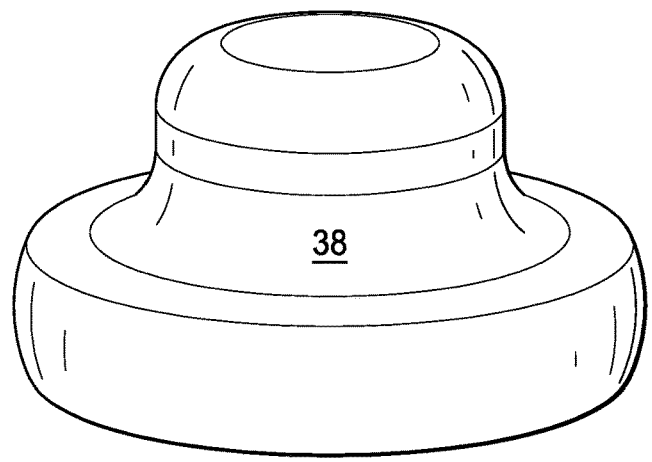
FIG. 12 shows a close up view of one of the stud bumps shown in FIG. 11.
Figure 13:
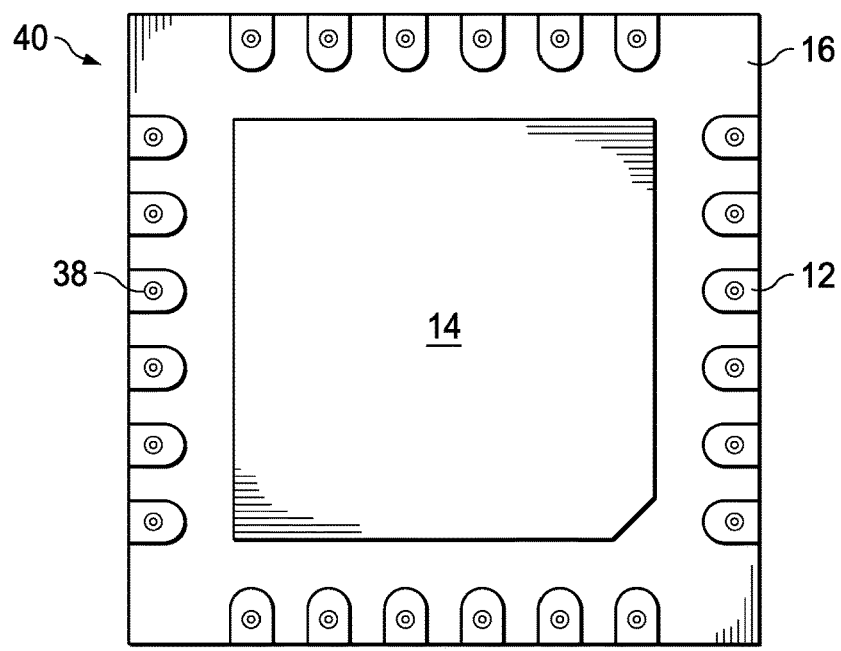
FIG. 13 is a top plan view of a bottom surface of a post singulation QFN device having a stud bump on each of the leads.
Figure 14:
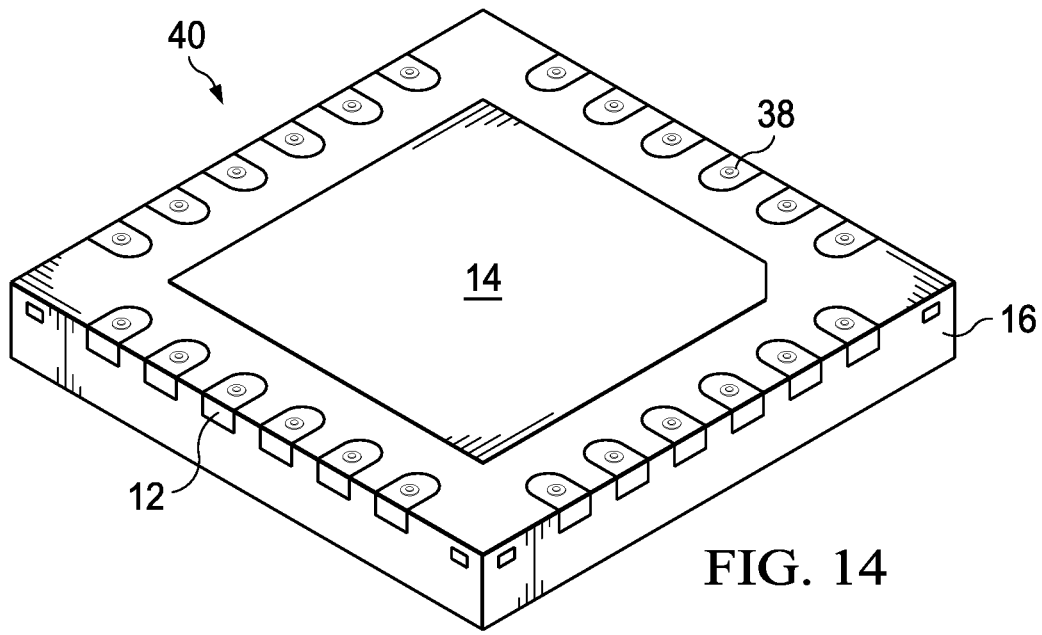
FIG. 14 is a perspective view of the QFN device shown in FIG. 13.
Figure 15:
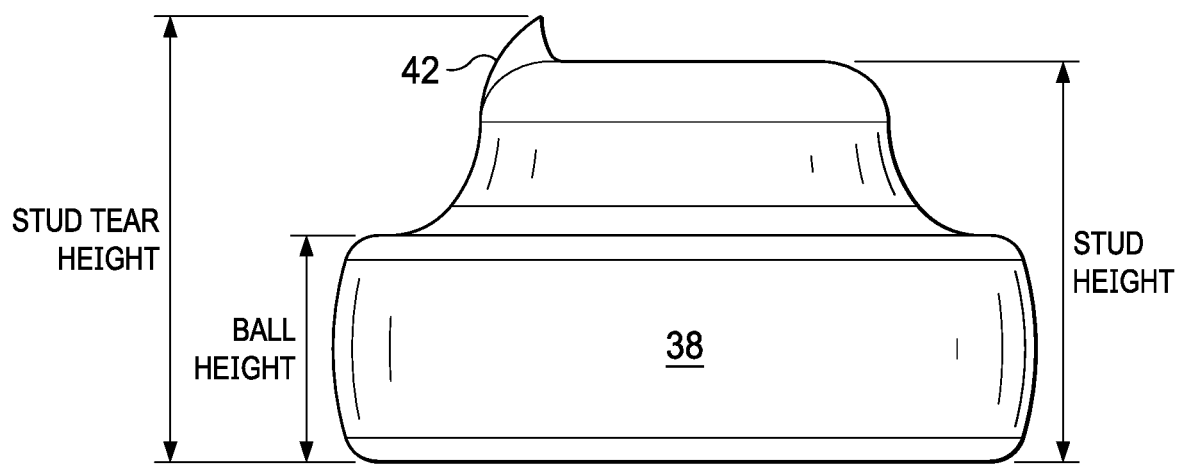
FIG. 15 is an enlarged side view of an exemplary stud bump as shown in FIG. 12.
Figure 16:
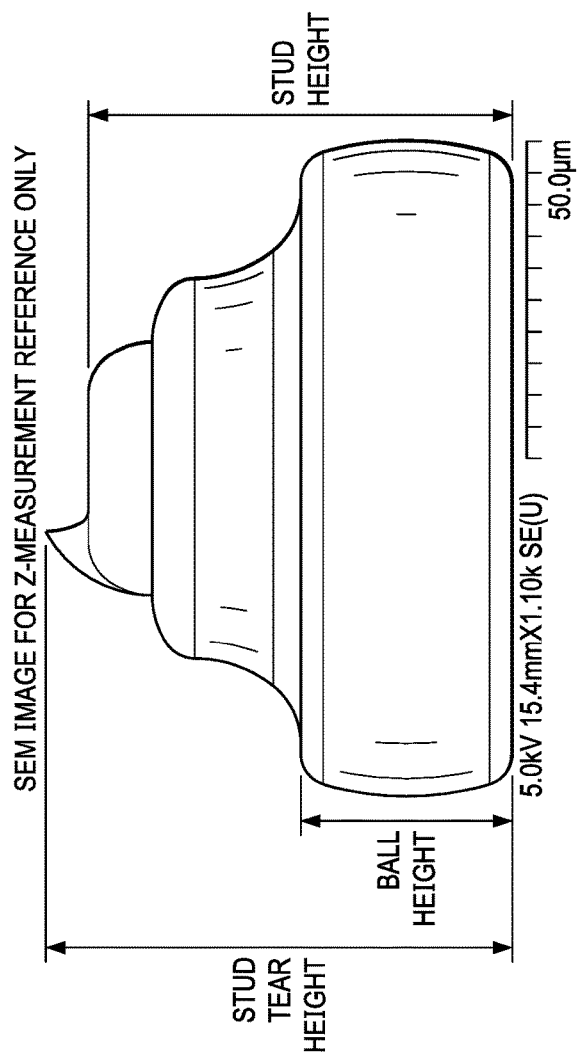
FIG. 16 is an enhanced perspective view of seven of at least 12 consecutive stud bumps on a QFN device and their respective X-axis distance, Y-axis distance, Ball Height, Stud Height and Stud tear height.
Figure 17:
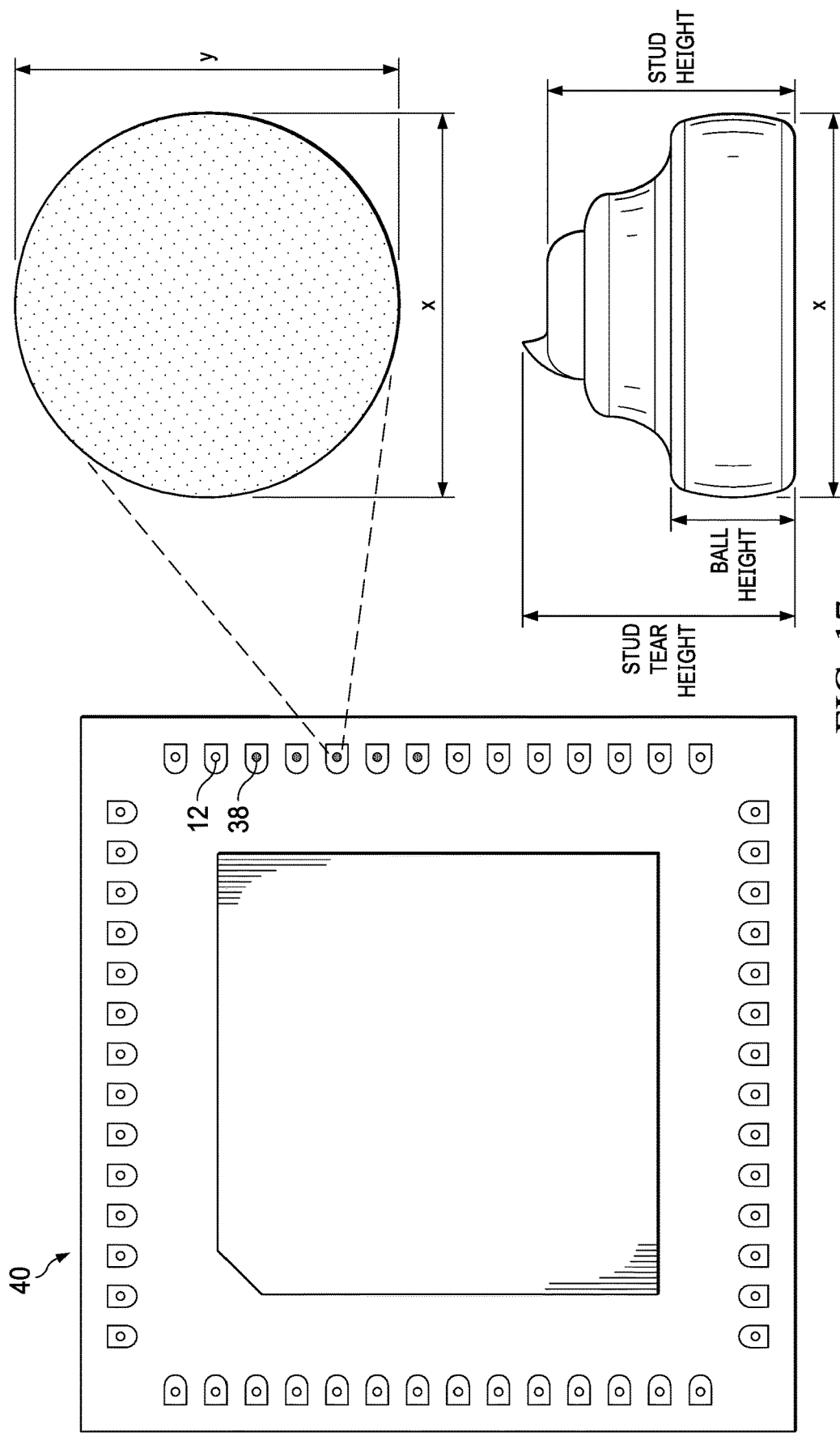
FIG. 17 is an enhanced view of the orientation of the X-axis distance & Y-axis distance of a stud bump on a QFN device.
Figure 31:
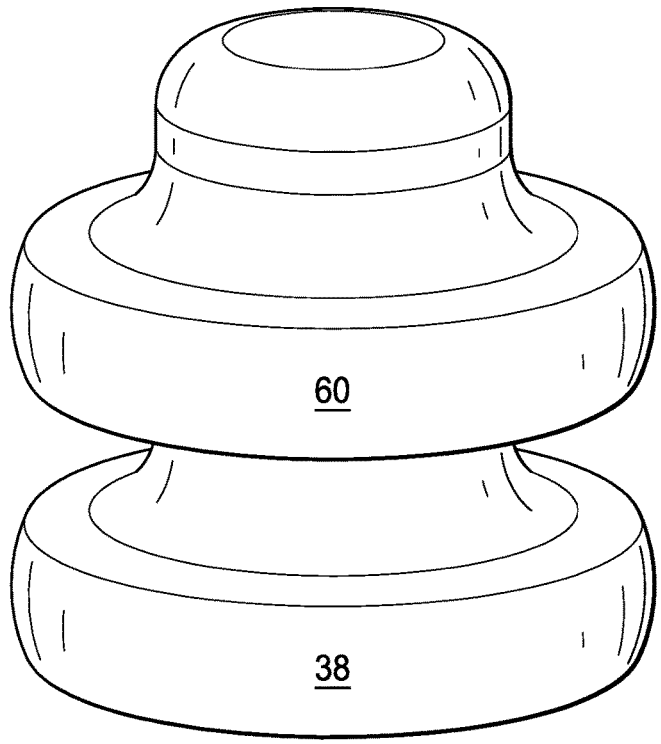
FIG. 31 is a variation of the device of FIGS. 11, 12, 15 & 16 in which a second stud bump can be added to the top of the stud bump.

In a first embodiment, a modification of the above wire bonding process is used to place stud bumps, rather than wire bonds, on one or more leads or contacts on a bottom surface of a block molded QFN device. A wirebonder 37 is placed over a lead 12 on a QFN device 12, as shown in FIG. 5. A copper wire 39 (or gold or aluminum) is fed into and through capillary 41 in wirebonder 37 at which time an electronic flame-off (EFO) spark is provided near the exposed end of wire 39, as shown in FIG. 6. A ball 43 is first formed by melting the end of the wire (which is held by capillary 41) as a result of electronic flame-off (EFO), as shown in FIG. 7. Capillary 41 containing ball 43 is next lowered such that ball 43 contacts and is compressed against a lead 12 on QFN device 10, resulting in compression ball 43 as it is attached (welded) to lead 12, as shown in FIG. 8. Next, wire 39 is clamped and capillary 41 is moved horizontally sheering off wire 39 from compressed ball 43 resulting in stud bump 38, as shown in FIG. 9. The process is repeated as wire bonder 37 is successively repositioned to place a stud bump 38 on more leads 12 on a bottom surface of block molded OFN devices resulting in QFN devices 40 with stud bumps or standoffs, as shown in FIG. 10. This step can occur before or after device testing. FIG. 11 shows an enhanced view of two of the leads 12 on one of the QFN devices 40 shown in FIG. 10, each of the leads having a stud bump 38. A close up, perspective view of one of stud bumps 38 is shown in FIG. 12. FIG. 13 shows a bottom surface of a post singulation QFN device 40 having a stud bump 38 on each of the leads 12. FIG. 14 is a side perspective view of a section of the device shown in FIG. 13. In one embodiment, stud bump placement occurs after a QFN device is encapsulated and ready for testing but prior to singulation. In another embodiment, the stud bumps may be placed after singulation. Stud bumps 38 are formed on one or more leads 12 of the QFN device 40 using a wire bonder, for example. Gold, copper, or palladium coated wire (PCC) are examples of wire that may be used. PCC wire is low cost and has a noble finish so it won't oxidize but bonding wire having other composition and size can also be used. An enlarged side view of an exemplary stud bump 38 is shown in FIG. 15. The consistency of the heights (i.e. the standoff) of the stud bumps is very uniform, as shown in FIG. 16 which shows an enhanced perspective view of seven of at least 12 consecutive stud bumps 38 on a QFN device 40 and their respective X-axis distance, Y-axis distance, Ball Height, Stud Height and Stud tear height, according to an embodiment. FIG. 17 shows an enhanced view of the orientation of the X-axis distance, Y-axis distance of a stud bump 38 on QFN device 40. The result is a high quality, high uniformity process because of the way the stud bumps are formed. In the embodiments shown in FIGS. 15 & 16, the bump height of each stud bump is about 55 mm. Each resulting stud bump further has a residual cut-off tail 42 (not shown in FIG. 12) adding an additional 5-6 mm to the existing stud bump height of 55 mm (see FIGS. 15 & 16) due to the cutting/tearing of the wire and shifting of the bonder as it moves to the next stud bump. Since the tear off height of each stud bump can be controlled, subsequent grinding off of the tails is not required, but a follow up grinding step to assure all of the stud bumps are cut off at the same height may be used. While a stud bump height of 55 mm was selected for the QFN device of FIGS. 10-23, lesser or greater stud bump heights can also be used, for example by grinding the stud bumps to a lower height as mentioned above, or by stacking stud bump on stud bump as shown in FIG. 31. The ultimate standoff height selected may depend on material selection, such as solder composition and surface finish.

Figure 18:
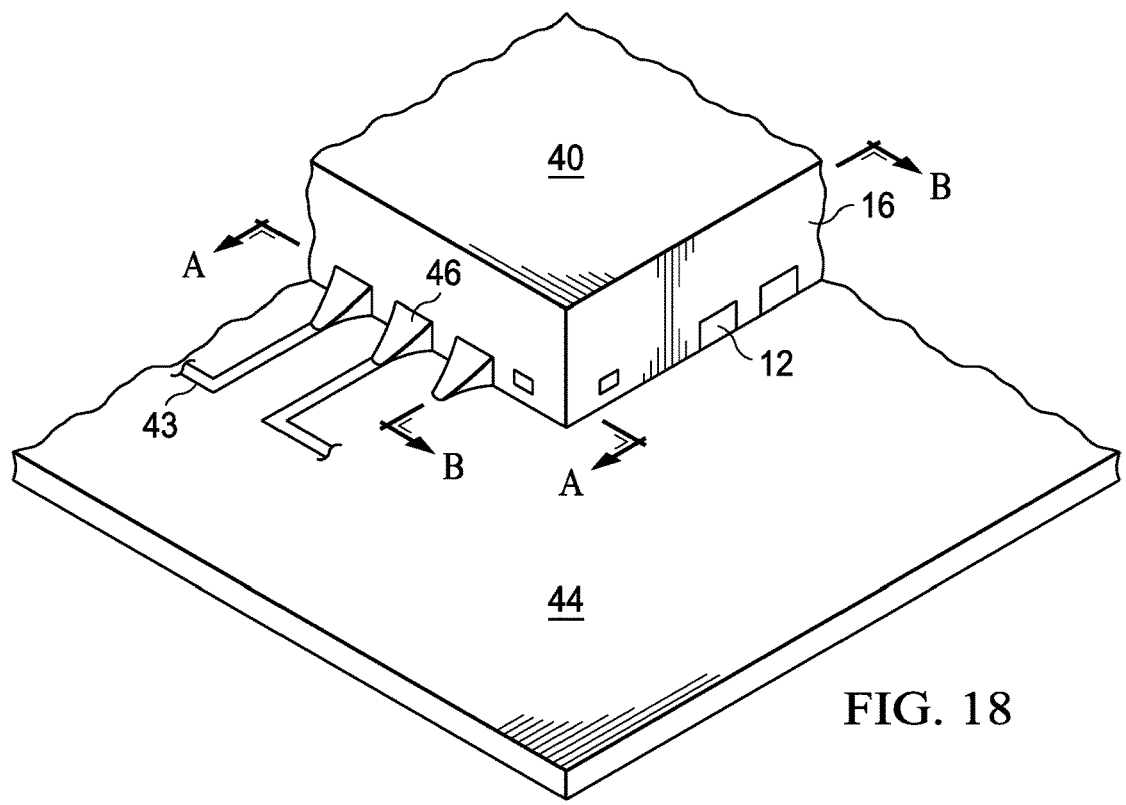
FIG. 18 is a partial perspective view of the QFN device of FIGS. 13 & 14 after it has been reflow soldered to a PWB.
Figure 19:
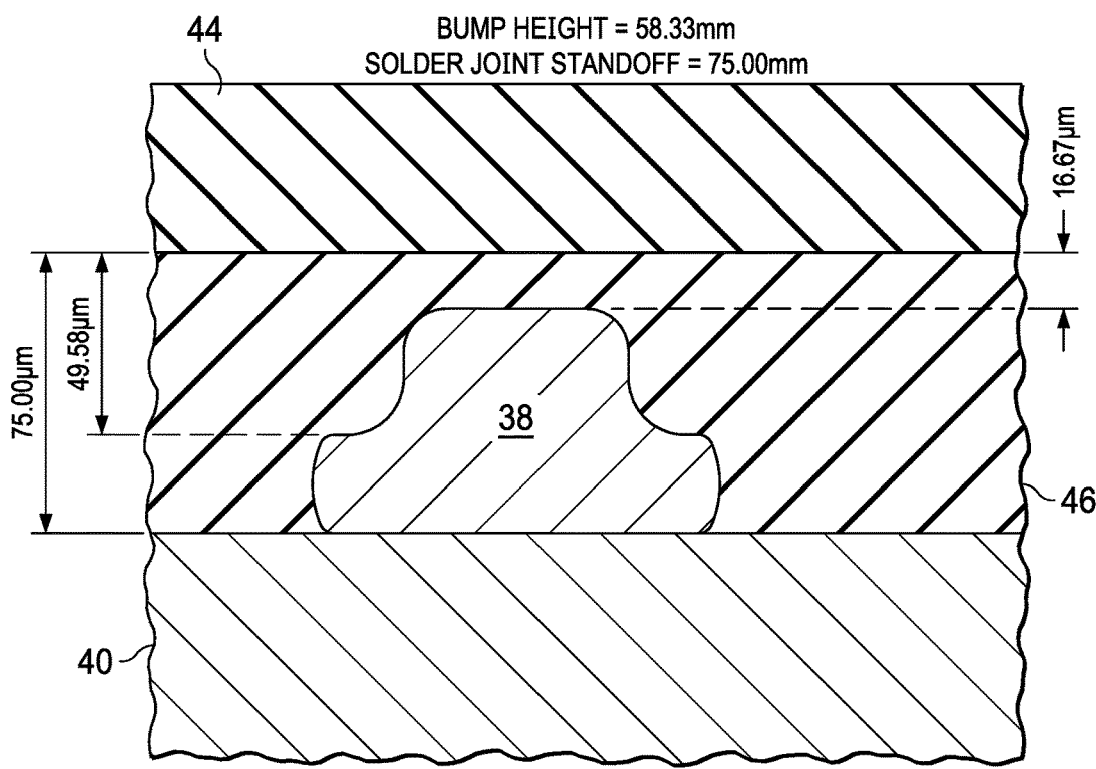
FIG. 19 is an upside down side sectional view of one stud bump 38 in FIG. 18 after reflow soldering to the PWB along the section lines A-A.
Figure 20:
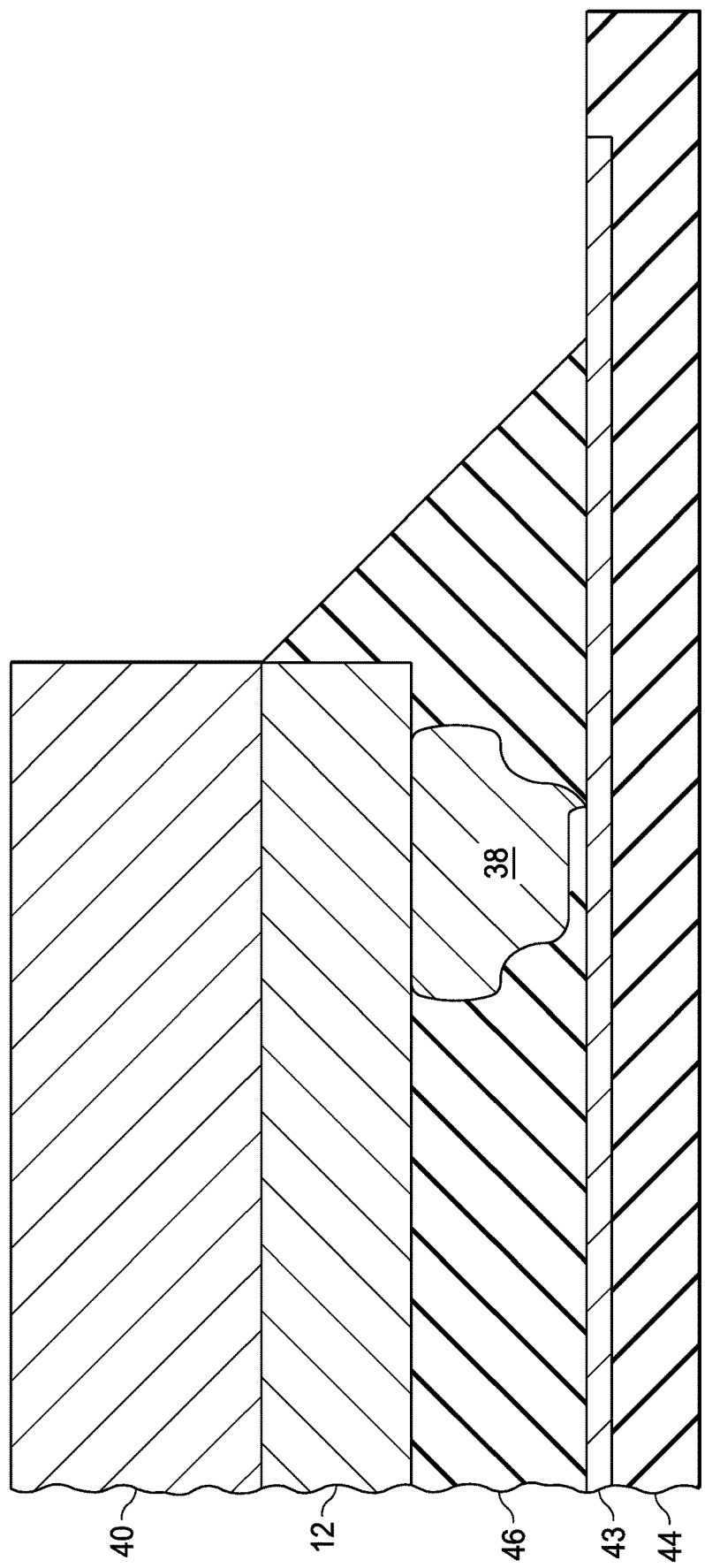
FIG. 20 is a partial cross-section view of QFN device 40 in FIG. 18 along section lines B-B.

FIG. 18 is a partial perspective view of a QFN device 40 of FIGS. 13 & 14 after it has been reflow soldered to a PWB 44. As a consequence of the stud bump on the bottoms of the leads of the package, a substantial solder fillet 46 is formed between leads or electrical contacts 43 on PWB 44 and the bottom and side surfaces of the leads 12 on the QFN device 40. FIG. 19 is an upside down cross-sectional view of a single stud bump 38 in FIG. 18 along section lines A-A after reflow soldering to the PWB. FIG. 20 is a partial cross-section view of QFN device 40 in FIG. 18 along section lines B-B. As can be seen in the exemplary embodiment, when adding the stud bump height standoff height of 58.33 mm to the height of the solder between PWB 44 and QFN device 40 the solder joint standoff height is approximately 75 mm. The wicking up the sidewall of the package at the side of the package leads extends about 25 um from the package bottom. This extension of the solder in FIGS. 18 & 20 not only along the bottom surface of leads 12 between QFN device 40 and PWB 44, but also up the package sidewall and further away from QFN device 40 along electrical contacts or leads of PWB 44 provides a solder joint or fillet that is amendable to inspection by automated solder joint inspection equipment from above. It is believed that this improved solder fillet is the result of improved solder dynamics between QFN 40 and PWB 44 resulting from the placement of the standoff on the bottom of the package leads. This improvement also allows the solder fillet to flow from capillary action, for example, and form a fillet outside of the package. It is noteworthy that as can be seen in FIGS. 18 & 20, this improvement also allows the solder to draw up the sidewall.

In the embodiments described, the rough sidewall surfaces of leads 12 in FIGS. 18 & 20 are bare copper that are not re-plated after being saw cut. Typically oxidation of the bare copper of the sidewall surface of leads 12 would impede a good solder connection. However, the inventors have found that despite this oxidation, the use of the stud bump standoff does indeed result in sufficient solder coverage of the lead sidewall to produce an inspectable solder fillet. This positive sidewall wetting could be the result of one or more of: 1) The lead frame 12/14 in the exemplary embodiment is copper coated with nickel palladium gold some of which may smear on the cut copper during sawing and interfere with subsequent oxidation of the sidewall surface of leads 12 and/or enhance vertical wetting; 2) The increased size of solder fillet 46 between QFN device 40 and PWB 44, and resulting improved solder dynamics, is more than sufficient to overcome any oxidation issue; 3) the exposed sidewall surfaces of leads 12 had not yet sufficiently oxidized at the time of soldering to prohibit the solder from wicking up the sidewall to cover most of the joint sidewall surface of leads 12.

Figure 21:
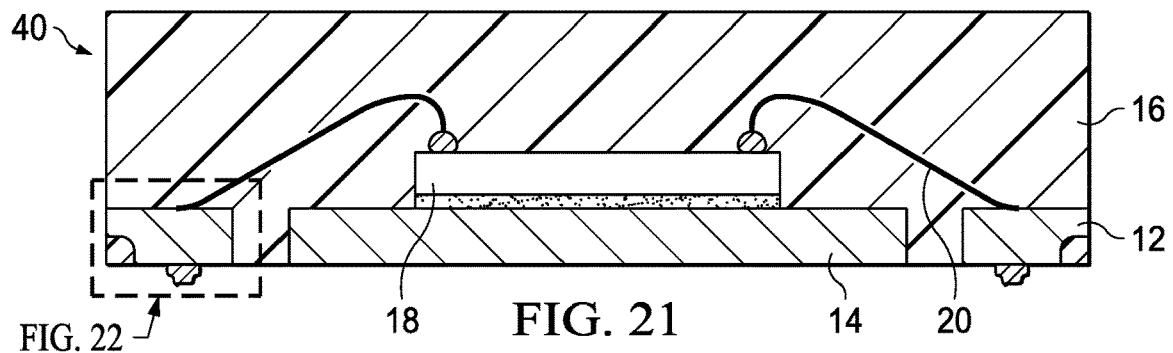
FIG. 21 is side sectional view of the QFN device of FIG. 13 but which includes a highlighted area that emphasizes a half-etched lead extending to the periphery of the QFN device.
Figure 22:
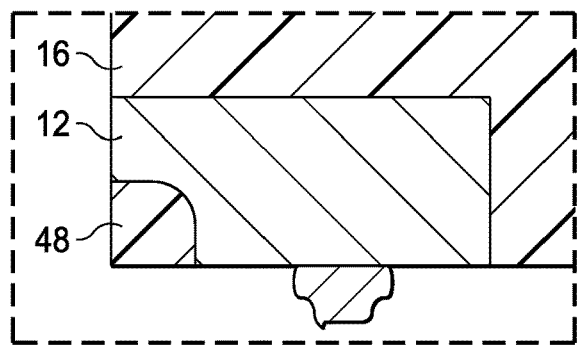
FIG. 22 illustrates the highlighted portion of FIG. 21 when the outer portion of each lead is half-etched.
Figure 23:
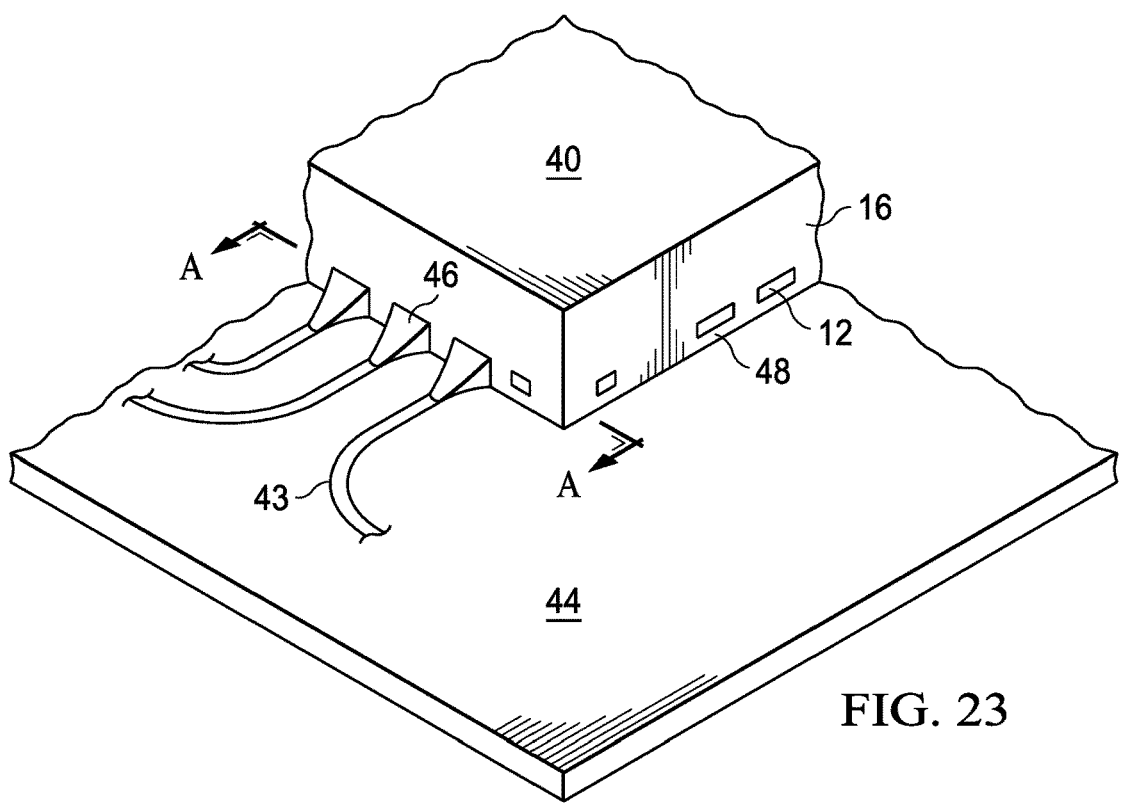
FIG. 23 is a partial perspective view of the QFN device of FIGS. 21 & 22 having half-etched leads similar to those in FIG. 10, which shows that the solder fillets of this embodiment also reach up from the electrical contacts or leads on the PWB to the half-exposed sidewall lead.

While the above embodiment shows a QFN device 40 having leads 12 with fully exposed side surfaces (i.e., full etch), the above-described technique of placing stud bumps on each lead of a QFN device is also applicable to QFN devices having a half-etched portion of the lead end, as shown when leads 12 in FIG. 21 are half-etched. FIG. 22 shows that the half-etched portion 48 of the lead end is filled in with encapsulation material 16, which means there is not a continuous solder able surface between the bottom of the encapsulant and the sidewall surfaces of each lead. The inventors have found (see FIG. 23) that the solder fillets also reach up from the electrical contacts or leads on the PWB to the half-exposed sidewall lead, despite the fact that there appears to be a discontinuous metal surface as a result of the half-etching of the end of the lead. This sidewall solder fillet is another beneficial result of the use of the stud bump standoff on the package leads and is thought by the inventors to be possible for the same reasons set forth above describing the positive sidewall soldering of the full sidewall surfaces of leads 12. In particular it is possible that sufficient metal smearing may result from the sawing of the package and the leads that a wicking path is provided over the package encapsulant below the half-etched end of the leads.

Figure 24:
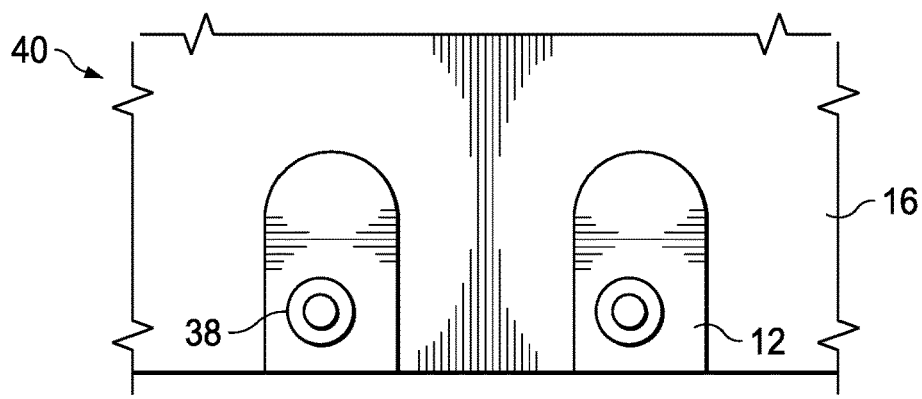
FIG. 24 is an enhanced view of two of the leads on one of the QFN devices shown in FIG. 10 in which the stud bumps are placed on the leads closer to the sidewall surface of the QFN device than those in FIG. 11.

In another embodiment, shown in FIG. 24, the stud bumps 38 in FIG. 10 are instead placed on the leads closer to the sidewall surface of QFN device 40.

Figure 25:
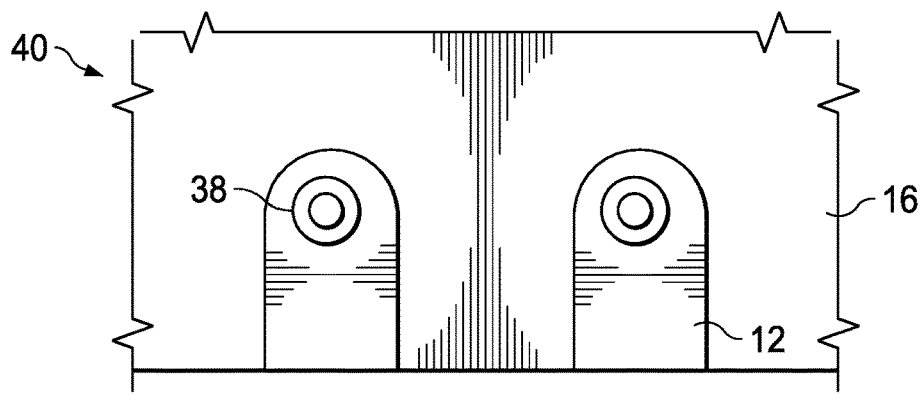
FIG. 25 is an enhanced view of two of the leads on one of the QFN devices shown in FIG. 10 in which the stud bumps are instead placed farther away from the sidewall surface of the QFN device than those in FIG. 11.

In yet another embodiment, shown in FIG. 25, the stud bumps 38 in FIG. 10 are instead placed farther away from the sidewall surface of QFN device 40.

Figure 26:
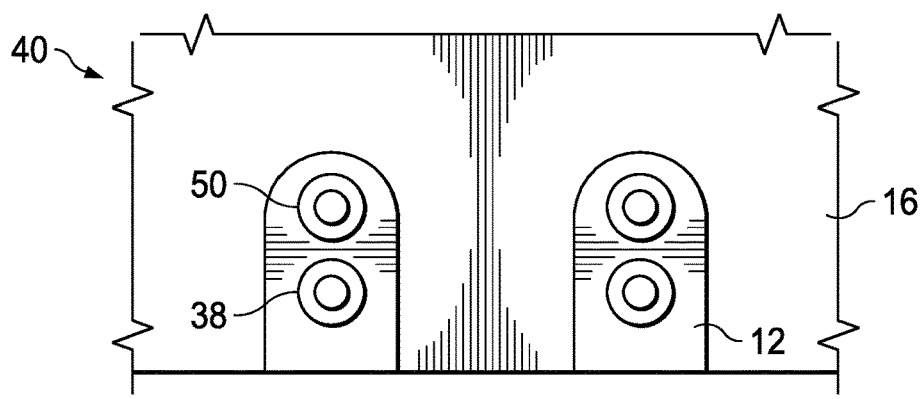
FIG. 26 is an enhanced view of two of the leads on one of the QFN devices shown in FIG. 10 in which two stud bumps are added to each of the leads of the QFN device.

In still another embodiment, shown in FIG. 26, a second stud bump 50 is added to each of the leads 12 of QFN device 40 shown in FIG. 10.

Figure 27:
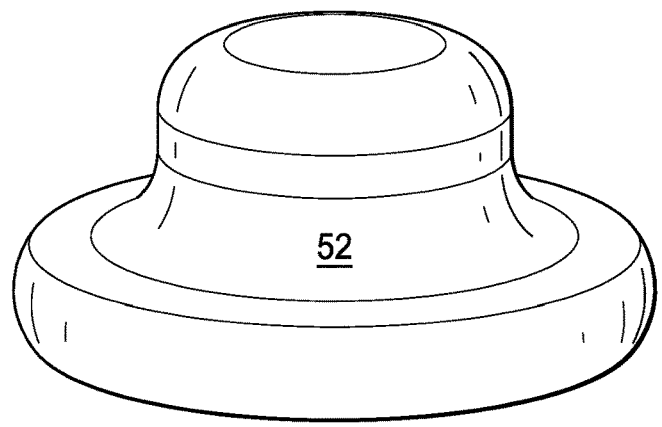
FIG. 27 is a variation of the device of FIGS. 11, 12, 15 & 16 in which the stud bumps can be shorter in height.

In yet still another embodiment, shown in FIG. 27, a stud bump 52 can be shorter in height than stud bump 38 in FIG. 12.

Figure 28:
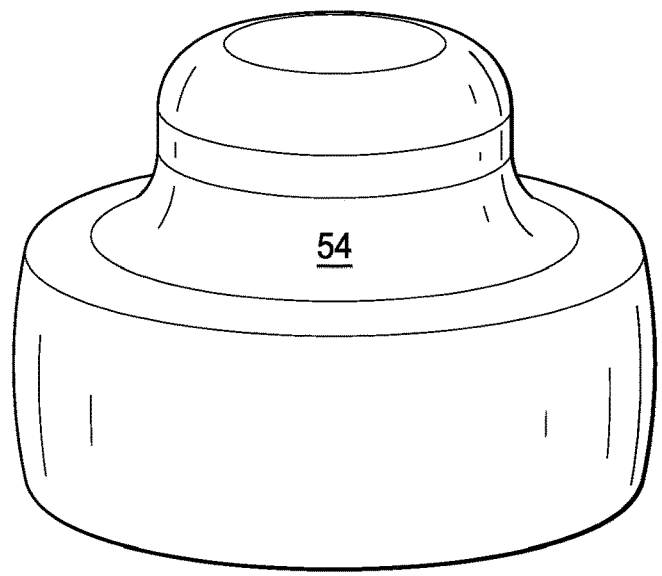
FIG. 28 is a variation of the device of FIGS. 11, 12, 15 & 16 in which the stud bumps can be taller in height.

In still another embodiment, shown in FIG. 28, the stud bump 54 can be taller in height than stud bump 38 in FIG. 12.

Figure 29:
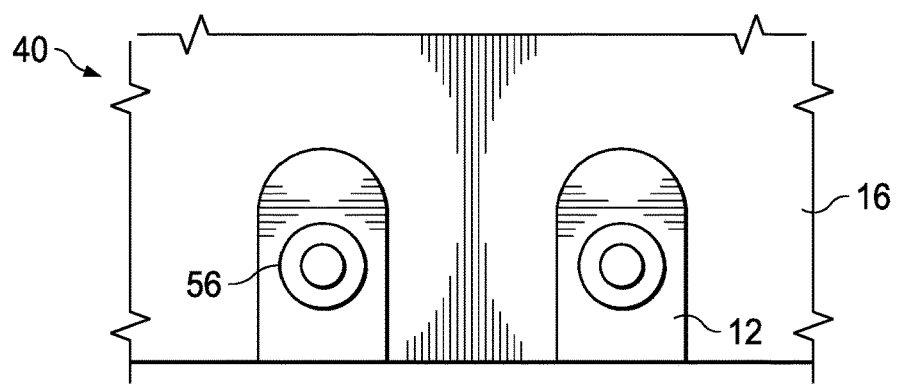
FIG. 29 is a variation of the device of FIGS. 11, 12, 15 & 16 in which the stud bumps can have a larger diameter.

In yet another embodiment, shown in FIG. 29, a stud bump 56 can have a larger diameter than stud bumps 38 in FIG. 12.

Figure 30:
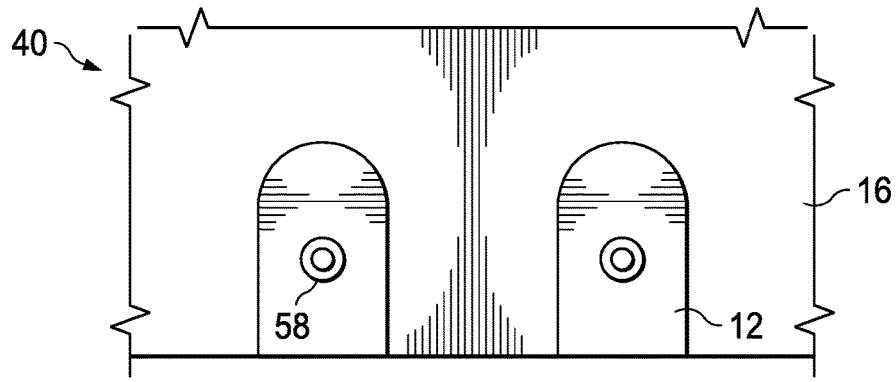
FIG. 30 is a variation of the device of FIGS. 11, 12, 15 & 16 in which the stud bumps can have a smaller diameter.

In yet another embodiment, shown in FIG. 30, a stud bump 58 can have a smaller diameter than stud bump 38 in FIG. 12.

In still yet another embodiment, shown in FIG. 31, a second stud bump 60 can be added to the top of stud bump 38 in FIG. 12.

Figure 32:
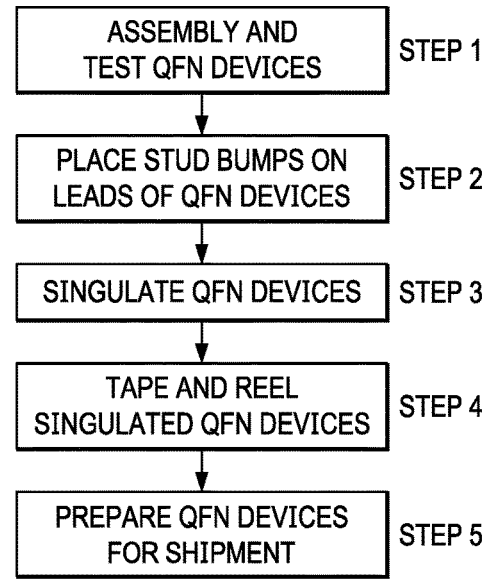
FIG. 32 illustrates a method process or flow for a QFN device having the stud bumps described herein.

A method process or flow for a QFN device having the stud bumps described above is shown in FIG. 32.

In step 1, the QFN devices are assembled in an assembly line, the assembly including an IC die being attached to a die support pad of a lead frame strip using a die attach material such as solder or heat conductive paste. Next, a wire bonder is used to install a bond wire from each lead of the lead frame to a conductive pad or lead on the IC die. Next, all of the QFN devices are bulk encapsulated with plastic mold compound, with only the bottom surface of each QFN device not being completely covered with the mold compound. Next, the QFN devices are tested for quality and functionality.

In step 2, the bulk encapsulated QFN devices, which have already been tested, are processed through an additional wire bonder step where a stud bump is placed on each lead of each QFN device. In another embodiment, the testing step occurs after placement of the stud bumps.

In step 3, the bulk encapsulated QFN devices are saw singulated.

In the embodiments described above the stud bump process is a standard wire bond process and can be achieved without custom equipment and at very low cost. The dimensions of the stud bump allow the leads of the QFN device to "stand off" from the PWB onto which the package is mounted, and during surface mount is encapsulated by solder forming an inspectable and highly reliable solder joint. Multiple stud bumps and different wire diameters can be used to further adjust the standoff height as needed. The wire bonding process, which in at least one embodiment, applies stud bumps as the standoff on each lead on the QFN device, can also be used to also adjust the location of the stud bumps as needed. Moreover, board-level reliability for QFN packages is important because there is no standoff between a traditional QFN device and the system board which results in CTE mismatching and resulting stress. The disclosed embodiments may well improve CTE mismatching and resulting stress since intermetallic compounds are formed along the PCC joint with the solder and may be mechanically locking the solder in place.

Moreover, while the above embodiments describe use of a stud bump as the artificial standoff mechanism, other techniques would be used, such as substituting rivets or pillars as the standoff mechanism, or even forming bumps around the height of stud bumps in the leads at the time of lead frame manufacture.

Those skilled in the art to which this Disclosure relates will appreciate that many other aspects and variations thereof are possible within the scope of the claimed invention, and further additions, deletions, substitutions and modifications may be made without departing from the scope of the Disclosure.

The invention claimed is:

1. A method of mounting an integrated circuit package to traces on a printed wiring board, said integrated circuit package comprising leads embedded in an encapsulant, wherein a bottom surface and at least a portion of a side surface of said leads are exposed from said encapsulant, said method comprising the steps of:

forming a stud bump on said bottom surface of at least one of said leads without using solder;

joining said stud bump, said bottom surface of said lead, and said traces on said printed wiring board with solder; and reflowing said solder such that said solder extends from said bottom surface of said lead to cover at least a portion of said portion of said side surface of said leads.

2. A method of mounting an integrated circuit package to traces on a printed wiring board, said integrated circuit package comprising leads embedded in an encapsulant, wherein a bottom surface and at least a portion of a side surface of said leads are exposed from said encapsulant, said method comprising the steps of:

forming a wire bond stud bump on said bottom surface of at least one of said leads;

joining said stud bump, said bottom surface of said lead, and said traces on said printed wiring board with solder; and reflowing said solder such that said solder extends from said bottom surface of said lead to cover at least a portion of said portion of said side surface of said leads.

3. A method, comprising:

embedding a plurality of leads in an encapsulant, said leads having a bottom surface and at least a portion of a side surface exposed from said encapsulant;

welding a standoff on a bottom surface of at least one of the leads;

joining said stand off and said bottom surface of said lead to a trace on a printed wiring board with solder such that said solder extends from said bottom surface of said lead to cover at least a portion of said side surface of said lead.

4. The method of claim 3, wherein said lead includes a half-etched end portion exposed from said encapsulant.

5. The method of claim 3, wherein said standoff is a stud bump.

6. The method of claim 5, wherein said stud bump is a wirebond stud bump.

7. A method, comprising:

welding a standoff on a bottom surface of each lead of a semiconductor package; and joining said stand offs to traces on a printed wiring board.

8. The method of claim 7, wherein said lead includes a half-etched end portion exposed from said encapsulant.

9. The method of claim 8, wherein said standoff is a stud bump.

10. The method of claim 9, wherein said stud bump is a wirebond stud bump.

11. A method, comprising:

forming an integrated circuit package having a plurality of leads embedded in an encapsulant, each lead having a standoff welded to a bottom surface, and at least a portion of a side surface exposed from said encapsulant; and attaching each standoff to metal trace of a printed wiring board on a surface of the printed wiring board.

12. The method of claim 11, wherein at least one of said leads includes a half-etched end portion exposed from said encapsulant.

13. The method of claim 11, wherein said standoff is a stud bump.

14. The method of claim 13, wherein said stud bump is a wirebond stud bump.

15. The method of claim 11, further comprising solder on said lead bottom surface and said at least a portion of said side surface.

16. A method, comprising:

providing a printed wiring board including metal traces on a top surface thereof;

forming an integrated circuit package mounted on said printed wiring board, said integrated circuit package including a plurality of leads having a bottom surface and at least a portion of a side surface exposed from an encapsulant, said integrated circuit package further including a standoff attached to said bottom surface of each of said leads without using solder; and soldering each standoff to a respective one of the metal traces.

17. The method of claim 16, wherein at least one of said leads includes a half-etched end portion exposed from said encapsulant.

18. The method of claim 16, wherein said standoff is a stud bump.

19. The method of claim 18, wherein said stud bump is a wirebond stud bump.

20. The method of claim 16, further comprising solder on said lead bottom surface and said at least a portion of said side surface.

* * * * *